United States Patent
Nikitin et al.

(10) Patent No.: US 11,901,273 B2
(45) Date of Patent: Feb. 13, 2024

(54) POWER MODULE WITH PRESS-FIT CONTACTS

(71) Applicant: Infineon Technologies AG, Neubiberg (DE)

(72) Inventors: Ivan Nikitin, Regensburg (DE); Peter Luniewski, Poing (DE)

(73) Assignee: Infineon Technologies AG, Neubiberg (DE)

( * ) Notice: Subject to any disclaimer, the term of this patent is extended or adjusted under 35 U.S.C. 154(b) by 228 days.

(21) Appl. No.: 17/385,731

(22) Filed: Jul. 26, 2021

(65) Prior Publication Data

US 2023/0026022 A1    Jan. 26, 2023

(51) Int. Cl.
| | |
|---|---|
| H01L 23/498 | (2006.01) |
| H01L 21/48 | (2006.01) |
| H01L 21/56 | (2006.01) |
| H01L 23/31 | (2006.01) |
| H01R 12/58 | (2011.01) |

(52) U.S. Cl.
CPC ...... *H01L 23/49811* (2013.01); *H01L 21/486* (2013.01); *H01L 21/4853* (2013.01); *H01L 21/565* (2013.01); *H01L 23/3171* (2013.01); *H01L 23/49833* (2013.01); *H01L 23/49844* (2013.01); *H01R 12/585* (2013.01); *H01L 23/49861* (2013.01)

(58) Field of Classification Search
CPC ......... H01L 2924/181; H01L 23/49811; H01L 23/3171; H01L 23/49833; H01L 23/49844; H01L 21/4853; H01L 21/486; H01L 21/565; H01R 12/585; H01R 12/7064

See application file for complete search history.

(56) References Cited

U.S. PATENT DOCUMENTS

| | | | |
|---|---|---|---|
| 2004/0145880 A1* | 7/2004 | Watanabe | H05K 3/308 361/803 |
| 2009/0146272 A1 | 6/2009 | Wieneke et al. | |
| 2012/0187554 A1* | 7/2012 | Oka | H05K 3/325 257/693 |
| 2012/0320545 A1* | 12/2012 | Lo Presti | H05K 3/325 361/752 |
| 2015/0380274 A1* | 12/2015 | Yoshimatsu | H01L 21/56 438/126 |
| 2016/0118314 A1* | 4/2016 | Ko | H01L 23/49548 257/712 |

(Continued)

FOREIGN PATENT DOCUMENTS

| | | |
|---|---|---|
| DE | 102006032436 A1 | 1/2008 |
| DE | 112016002302 T5 | 3/2018 |

(Continued)

*Primary Examiner* — Alonzo Chambliss
(74) *Attorney, Agent, or Firm* — Murphy, Bilak & Homiller, PLLC

(57) ABSTRACT

A method of forming a semiconductor device includes providing a substrate that comprises a metal region, forming an encapsulant body of electrically insulating material on an upper surface of the metal region, forming an opening in the encapsulant body, and inserting a press-fit connector into the opening, wherein after inserting the press-fit connector into the opening, the press-fit connector is securely retained to the substrate and an interfacing end of the press-fit connector is electrically accessible.

18 Claims, 15 Drawing Sheets

(56) References Cited

U.S. PATENT DOCUMENTS

| | | | | |
|---|---|---|---|---|
| 2016/0143187 A1* | 5/2016 | Sekino | ............... | H01L 23/4006 |
| | | | | 29/832 |
| 2021/0398887 A1 | 12/2021 | Niendorf et al. | | |
| 2023/0121335 A1* | 4/2023 | Nikitin | ............... | H01L 21/4853 |
| | | | | 257/690 |

FOREIGN PATENT DOCUMENTS

| | | | |
|---|---|---|---|
| JP | 2016154258 A | 8/2016 | |
| WO | 2021214504 A1 | 10/2021 | |

\* cited by examiner

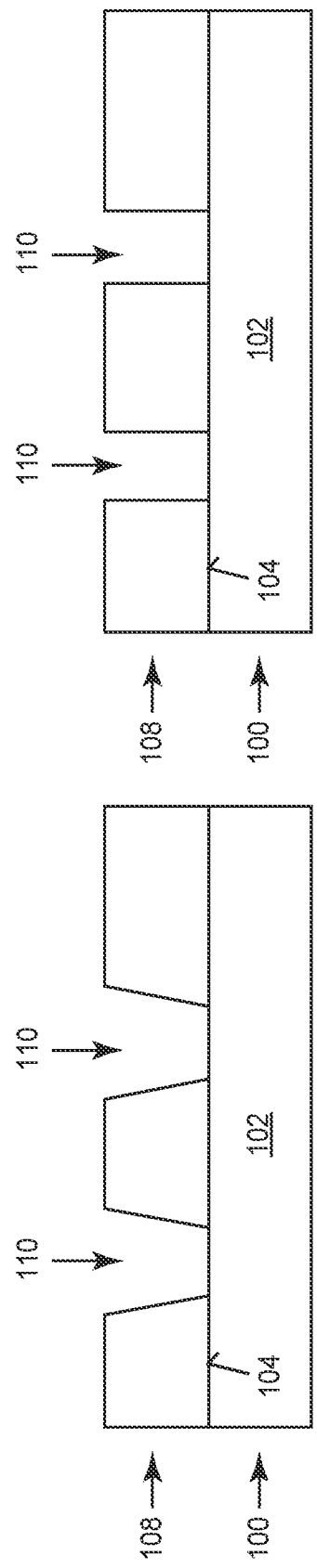

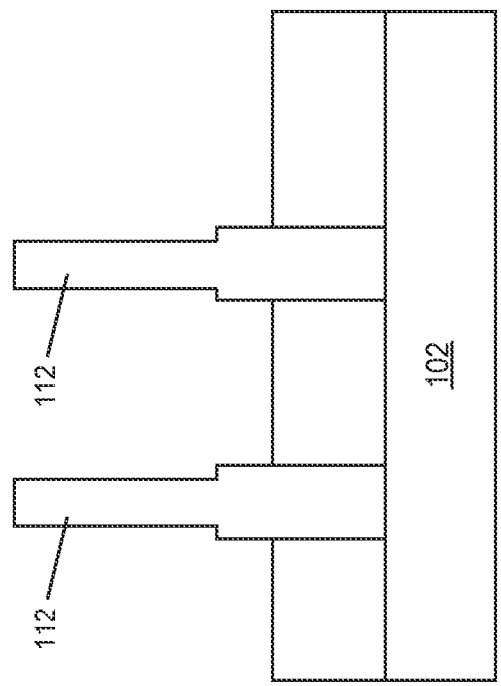
FIG. 3A
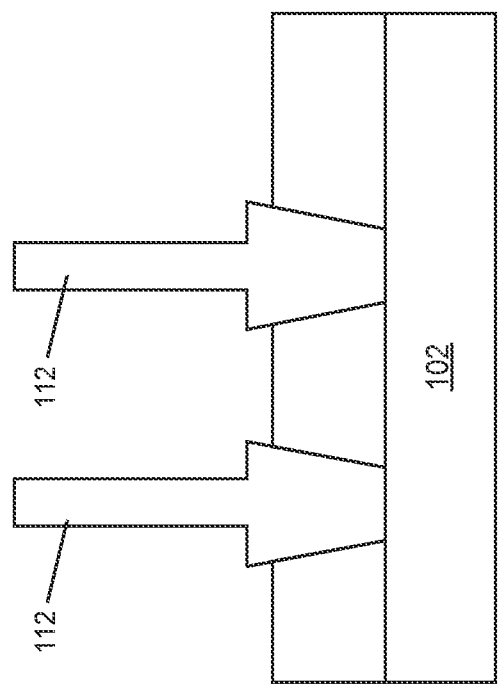
FIG. 3B
FIG. 3

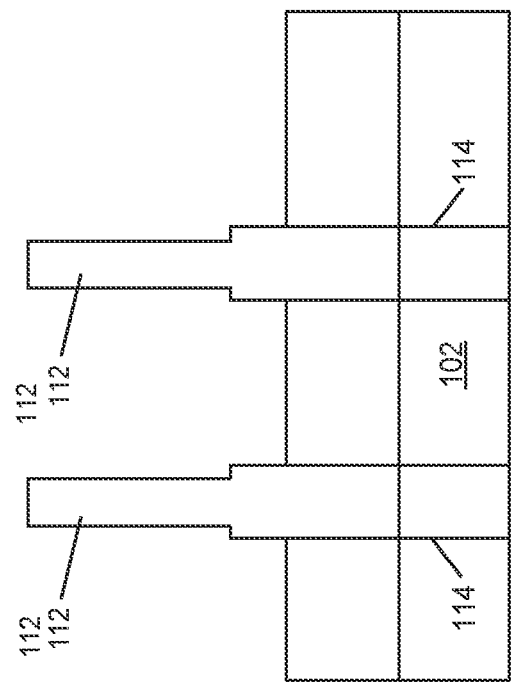
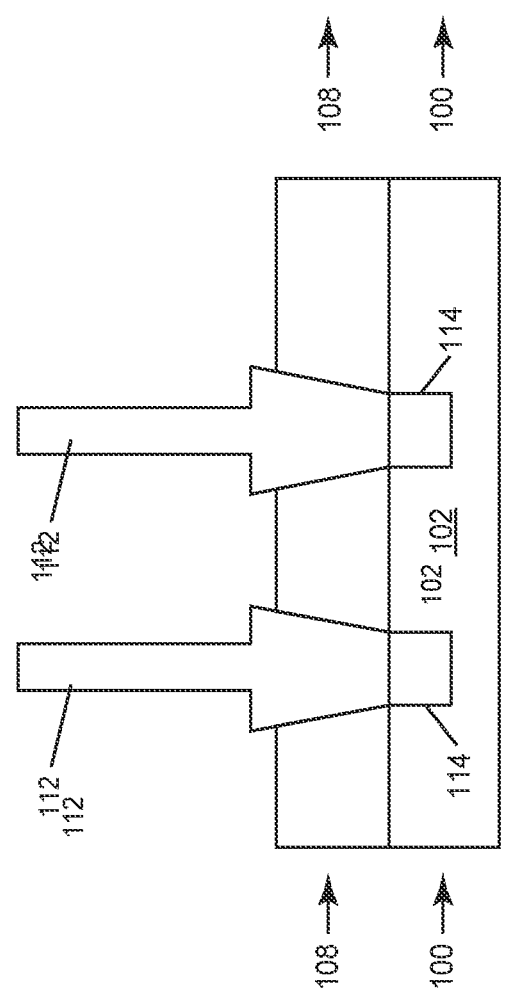
FIG. 6

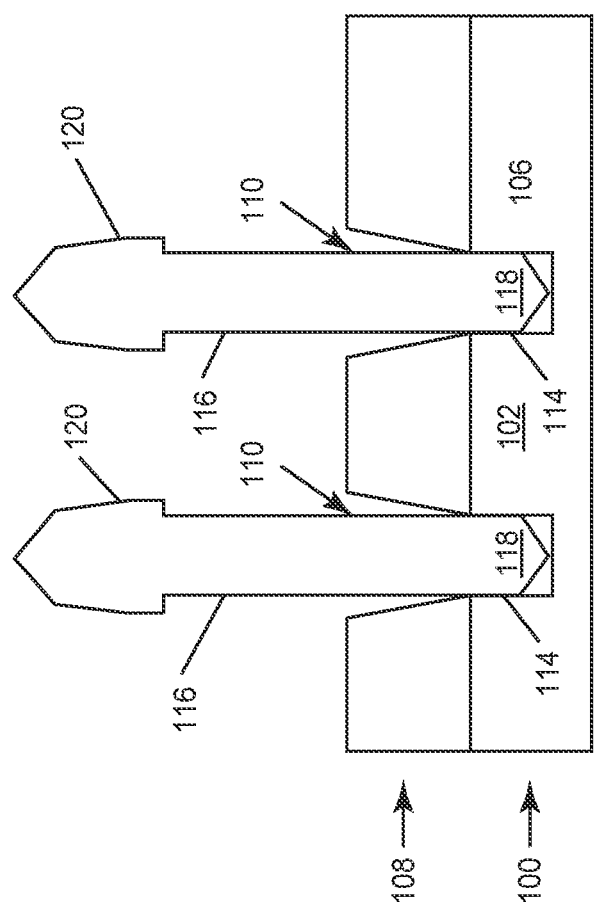

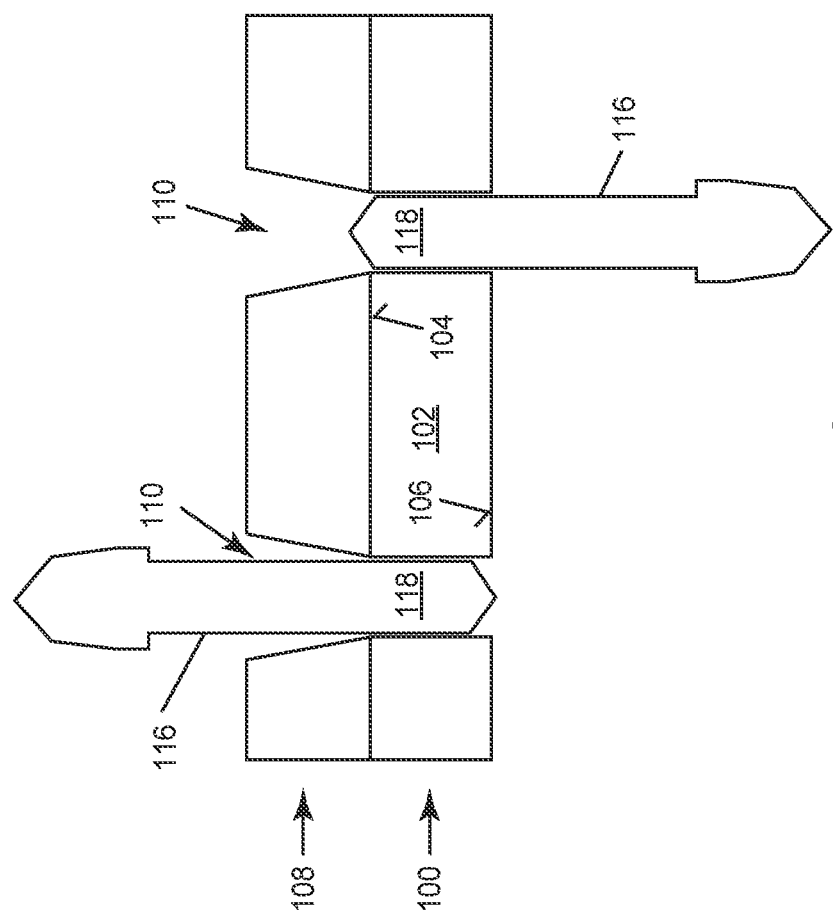

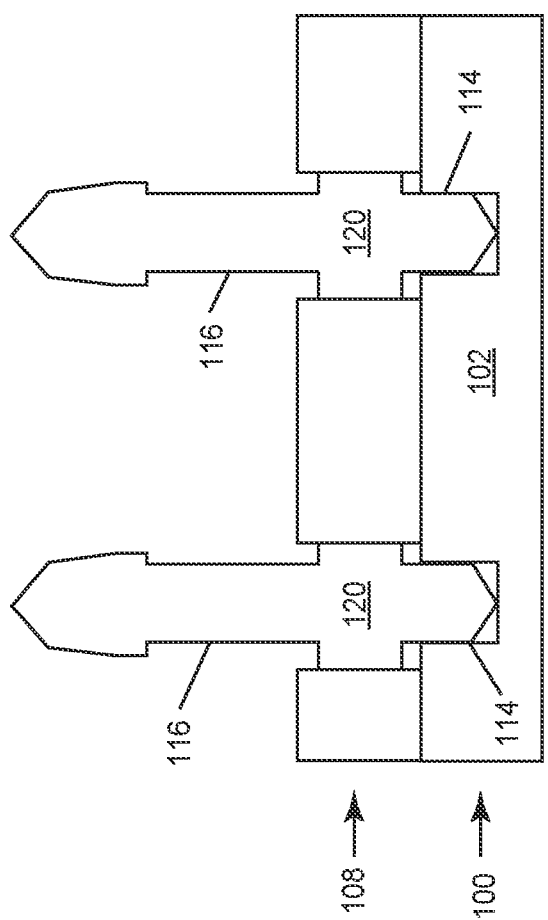

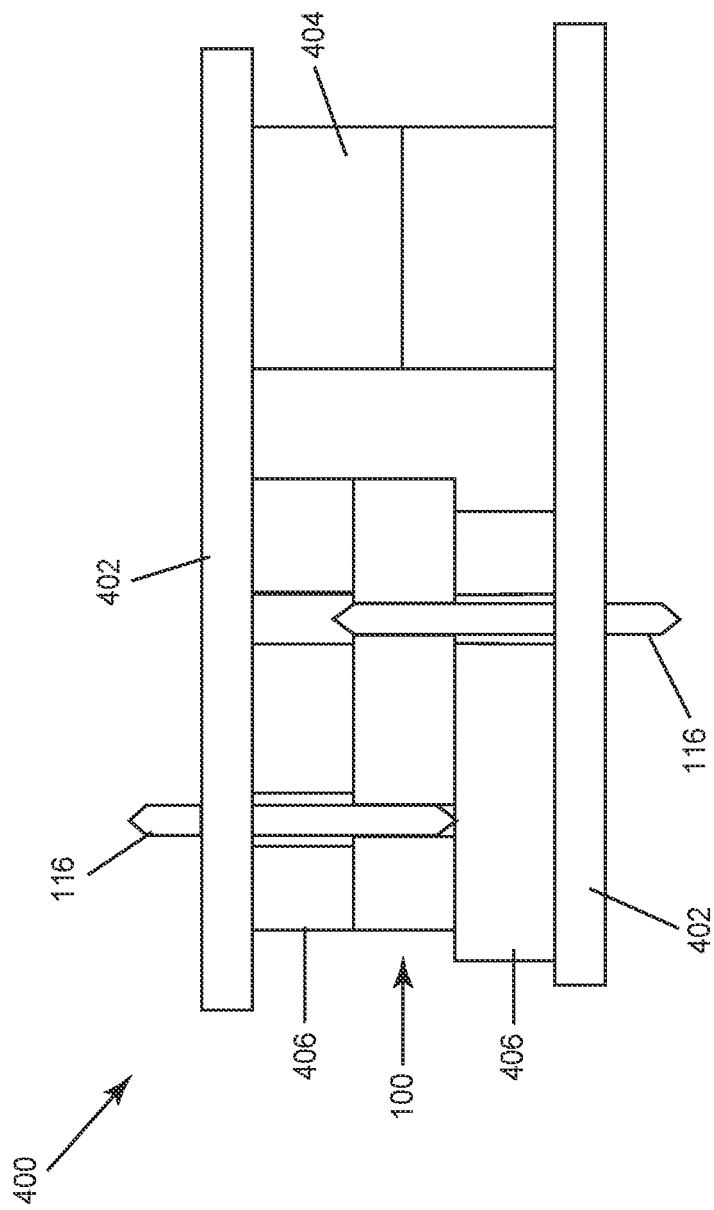

POWER MODULE WITH PRESS-FIT CONTACTS

BACKGROUND

Many applications such as automotive and industrial applications utilize power semiconductor devices such as IGBTs (insulated gate bipolar transistors), power MOSFETs (metal oxide semiconductor field effect transistors), power diodes, etc. These devices arranged in a power converter circuit such as single and multi-phase half-wave rectifiers, single and multi-phase full-wave rectifiers, voltage regulators, etc. Integrated power modules (IPMs) can include power semiconductor devices that form a power converter circuit and the logic controls the switching of the power semiconductor devices. IPMs can include a multi-layer power electronic substrate such as a DBC (direct bonded copper), IMS (insulated substrate) or AMB (active metal brazed) substrate and a plastic housing that encloses the multi-layer power electronic substrate. While offering advantageous performance characteristics, features of IPMs such as the power electronics substrate and the plastic housing make IPMs cost prohibitive in certain applications.

It would be desirable to produce a produce a semiconductor power module at lower cost with similar or better performance characteristics than conventional solutions.

SUMMARY

A method of forming a semiconductor device is disclosed. According to an embodiment, the method comprises providing a substrate that comprises a metal region, forming an encapsulant body of electrically insulating material on an upper surface of the metal region, forming an opening in the encapsulant body, and inserting a press-fit connector into the opening, wherein after inserting the press-fit connector into the opening, the press-fit connector is securely retained to the substrate and an interfacing end of the press-fit connector is electrically accessible.

Separately or in combination, the encapsulant body is formed by a molding process whereby liquified mold material is formed on the substrate and subsequently hardened, wherein forming the opening comprises arranging a fixed pin over the substrate prior to the molding process, and wherein the fixed pin prevents the liquified mold material from forming at a location corresponding to the opening.

Separately or in combination, the method further comprises forming a recess in the upper surface of the metal region, wherein the opening is formed directly over the recess, and wherein the opening is larger than the recess such that the recess is completely exposed by the opening.

Separately or in combination, the recess has a first diameter at the upper surface of the metal region, and a diameter of the opening at a lower surface of the encapsulant body that interfaces with the upper surface of the metal region is greater than the first diameter.

Separately or in combination, the opening is tapered such that diameter of the opening gradually increases moving away from the lower surface of the encapsulant body.

Separately or in combination, the recess is formed before forming the encapsulant body.

Separately or in combination, the recess is formed after forming the encapsulant body.

Separately or in combination, the recess extends completely through the metal region, and the recess is formed by drilling the upper surface of the metal region and by drilling a rear surface of the metal region that is opposite from the upper surface of the metal region.

Separately or in combination, inserting the press-fit connector into the opening comprises inserting the press-fit connector into the recess, and wherein the press-fit connector is securely retained to the substrate by compressive force applied by the substrate to a base portion of the press-fit connector.

Separately or in combination, the base portion of the press-fit connector has a higher material hardness than the metal region.

Separately or in combination, the method further comprises arranging a receptacle in the opening and attaching the receptacle to the substrate, inserting the press-fit connector into the opening comprises inserting the press-fit connector into the receptacle, and after inserting the press-fit connector into the opening the press-fit connector is securely retained to the substrate via the receptacle.

Separately or in combination, the substrate is an entirely metal structure.

Separately or in combination, the substrate is a power electronics substrate that comprises an electrically insulating substrate and a structured metallization layer disposed thereon, and wherein the metal region is a portion of the structured metallization layer.

A semiconductor device is disclosed. According to an embodiment, the semiconductor device comprises a substrate that comprises a metal region, an encapsulant body of electrically insulating material on an upper surface of the metal region, an opening in the encapsulant body, and a press-fit connector arranged in the opening and securely retained to the substrate such that an interfacing end of the press-fit connector is electrically accessible.

Separately or in combination, the semiconductor device further comprises a recess in the upper surface of the metal region, and the opening is directly over the opening and is larger than the recess such that the recess is completely exposed by the opening.

Separately or in combination, the press-fit connector is securely retained to the substrate by compressive force applied by the substrate to a base portion of the press-fit connector.

Separately or in combination, the press-fit connector comprises K88 copper alloy, and the metal region comprises a metal with a lower material hardness than K88 copper alloy.

Separately or in combination, the semiconductor device further comprises one or more power semiconductor devices mounted on the substrate and encapsulated by the molded body, and the press-fit connector provides a point of electrical contact to a terminal of the one or more power semiconductor devices via the metal region.

Separately or in combination, the semiconductor device is a power semiconductor module that comprises a power converter circuit.

Separately or in combination, the substrate is arranged between two printed circuit boards, and wherein the semiconductor device comprises one of the press-fit connectors extending into each of the two printed circuit boards.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B, illustrates from a cross-sectional perspective openings formed in the encapsulant body, according to embodiments. FIG. 2A illustrates a geometry of the openings according to one embodiment, and FIG. 2B illustrates a geometry of the openings according to another embodiment.

FIG. 3, which includes FIGS. 3A and 3B, illustrates from a cross-sectional perspective a technique for forming the openings in the encapsulant body, according to an embodiment. FIG. 3A illustrates the technique used to form openings with one geometry, and FIG. 3B illustrates the technique used to form openings with another geometry.

FIGS. 4A and 4B, illustrates from a cross-sectional perspective recesses formed in the metal region underneath the openings, according to embodiments. FIG. 4A illustrates a geometry of the recesses according to one embodiment, and FIG. 4B illustrates a geometry of the recesses according to another embodiment.

FIGS. 5A and 5B, illustrates from a plan-view perspective geometries of the openings and the recesses, according to embodiments. FIG. 5A illustrates a plan-view geometry of the openings and the recesses according to one embodiment, and FIG. 5B illustrates a plan-view geometry of the openings and the recesses according to one embodiment.

FIG. 6, which includes FIGS. 6A and 6B, illustrates from a cross-sectional perspective a technique for forming the openings in an encapsulant body over recesses formed in a substrate, according to an embodiment. FIG. 6A illustrates the technique used to form openings with one geometry, and FIG. 6B illustrates the technique used to form openings with another geometry.

FIG. 7, which includes FIGS. 7A, 7B and 7C, illustrates from a cross-sectional perspective inserting press-fit connectors into the openings and the recesses, according to embodiments. FIG. 7A illustrates an arrangement of the press-fit connectors in the recesses in a first embodiment, FIG. 7B illustrates an arrangement of the press-fit connectors in the recesses in a second embodiment, and FIG. 7C illustrates an arrangement of the press-fit connectors in the recesses in a third embodiment.

FIG. 9A illustrates the power semiconductor module with the internal features being visible, and FIG. 9B illustrates the exterior of the power semiconductor module.

FIG. 12 illustrates from a cross-sectional perspective an assembly comprising two printed circuit boards and a substrate with press-fit connectors sandwiched in between the two printed circuit boards.

DETAILED DESCRIPTION

Embodiments of a semiconductor device comprising press-fit connectors and corresponding methods for forming a semiconductor device comprising press-fit connectors are described herein. The semiconductor device may include a substrate, an encapsulant body, and one or more semiconductor dies that are encapsulated by the encapsulant body. The press-fit connectors are securely retained to a metal region of the substrate and form an electrical connection with a terminal of the semiconductor dies via the substrate. The press-fit connectors may protrude out from a main face of the encapsulant body, thereby enabling a press-fit connection between the semiconductor device and a receiving apparatus, such as a PCB. Advantageous techniques are described herein for providing the substrate and securing the press-fit connectors to the substrate. In one embodiment, a recess is formed in the metal region of the substrate, and the press-fit connectors are securely retained by compressive force applied between the metal region and the press-fit connectors. Because the substrate can be formed using low-cost metal processing techniques and the press-fit connectors can be reliably secured to the substrate using the techniques described herein, a semiconductor device such as a power semiconductor module with advantageous performance can be formed at lower cost than current solutions.

Figure 1:
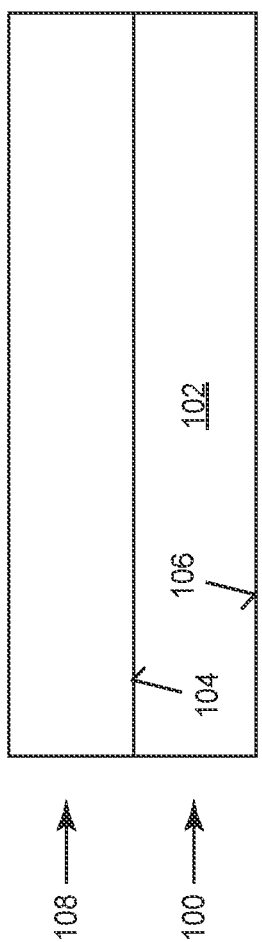
FIG. 1 illustrates from a cross-sectional perspective providing a metal region with an encapsulant body on an upper surface of the metal region, according to an embodiment.

Referring to FIG. 1, a method of forming a semiconductor device comprises providing a substrate 100 that comprises a metal region 102. Generally speaking, the substrate 100 can be any carrier structure or electronics element with sufficient mechanical strength to accommodate the press-fit connector described herein. According to an embodiment, the substrate 100 is a completely metal structure. Examples of these structures include lead frame structures, e.g., a die pad or landing pad, and metal interconnect clips. According to another embodiment, the substrate 100 is a multi-layer electronics carrier. Examples of these structures include power electronics carriers, e.g., DCB substrates, AMB substrates, IMS substrates and PCBs. In that case, the metal region 102 can be a structured metallization layer that is disposed on an upper surface of an insulating region (not shown in FIG. 1). The metal region 102 can comprise or be plated with Cu, Ni, Ag, Au, Pd, Pt, NiV, NiP, NiNiP, NiP/Pd, Ni/Au, NiP/Pd/Au, or NiP/Pd/AuAg, for example. Generally speaking, the metal region 102 can have a thickness as measured between an upper surface 104 and a lower surface 106 in the range of 0.5 mm thick and 10 mm thick. In one particular embodiment, the metal region 102 has a thickness is in the range of 1.0 mm thick and 2.0 mm thick.

An encapsulant body 108 of electrically insulating material is formed on the upper surface 104 of the metal region 102. According to an embodiment, the encapsulant body 108 is formed by a molding technique whereby the substrate 100 is placed in a three-dimensional chamber and liquified encapsulant material, e.g., a thermosetting plastic, is injected into the into the chamber. Examples of these techniques include injection molding, transfer molding, and compression molding. According to another embodiment, the encapsulant body 108 is formed by a lamination technique whereby multiple layers of laminate material, e.g., woven glass fiber, FR-4, etc., are successively stacked on top of one another.

Referring to FIG. 2, openings 110 are formed in the encapsulant body 108. The openings 110 are formed to reach the upper surface 104 of the substrate 100. Generally speaking, the openings 110 can be formed according to any of a wide variety of techniques such as drilling, etching, etc. The openings 110 shown in FIG. 2A are tapered such that a diameter of the opening 110 increases moving away from the upper surface 104 of the metal region 102. The openings 110 shown in FIG. 2B have a substantially uniform diameter throughout a complete depth of the opening 110. More generally, the openings 110 can have a wide variety of geometries, and may be tailored to accommodate a particular press-fit connector geometry.

Referring to FIG. 3, a technique for forming the openings 110 is shown. According to this technique, the encapsulant body 108 is formed by a molding process whereby liquified mold material is formed on the substrate 100 and subsequently hardened. Before performing the molding process, a fixed pin 112 is arranged over the substrate 100. The fixed pin 112 has a geometry corresponding to the desired geometry of the opening. The fixed pin 112 prevents the liquified mold material from forming at a location corresponding to the opening 100. That is, the fixed pin 112 is used to displace the liquified material, thereby creating a void in the encapsulant body 108. Alternatively, the openings 110 may be formed by initially the encapsulant body 108 to cover the substrate 100 and subsequently removing encapsulant material, e.g. by etching, drilling, etc.

Figure 4:
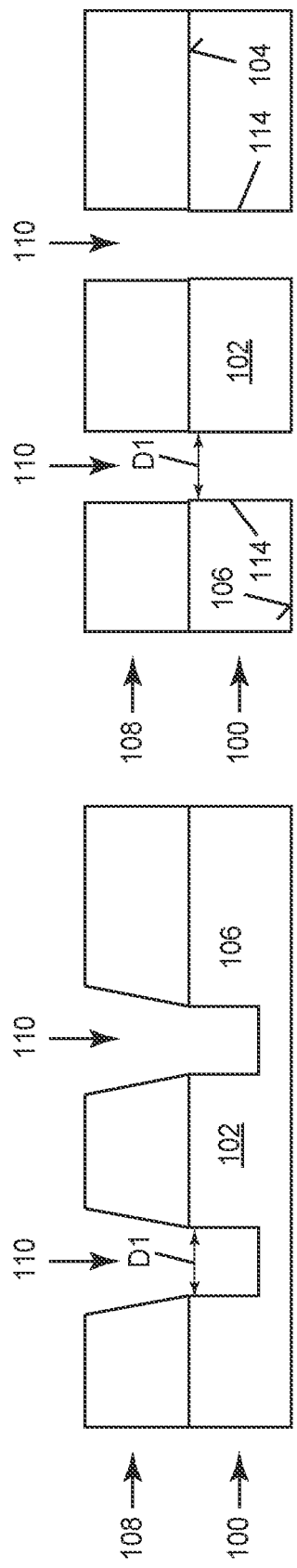
FIG. 4, which includes

Referring to FIG. 4, after forming the encapsulant body 108 and forming the openings 110, a recess 114 is formed in the upper surface 104 of the substrate 100. The recess 114 is formed in a portion of the substrate 100 that is exposed by the openings 110. The recess 114 can be formed by any of a variety of metal processing techniques, e.g., drilling, etching, punching, etc. According to an embodiment, the recess 114 is formed by a mechanical drilling technique whereby a drill bit penetrates the metal region 102. According to another embodiment, the recess 114 is formed by a laser drilling technique whereby highly concentrated energy is directed at the upper surface 104 of the metal region 102. As shown in FIG. 4A, the recess 114 can be formed to partially penetrate the metal region 102 such that a thickness of metal remains beneath the recess 114. As shown in FIG. 4B, the recess 114 can be formed so as to completely extend between the upper surface 104 and the lower surface 106 of the metal region 102. In this case, the recess 114 can be formed by drilling the upper surface 104 of the metal region 102 and by drilling the rear surface 106 of the metal region 102. As shown, the recess 114 can have a substantially uniform diameter throughout a depth of the recess 114. Alternatively, the recess 114 can have a variety of different geometries such as a tapered geometry wherein a width of the recess 114 decreases moving away from the upper surface 104.

According to an embodiment, the opening 114 is formed to be larger than the recess 114. In particular, the recess 114 may have a first diameter D1 that is measured at the upper surface 104 of the metal region 102, and a diameter of the opening 110 at a lower surface of the encapsulant body 108 that interfaces with the upper surface 104 of the metal region 102 is greater than the first diameter D1. That is, the opening 114 is wider than the recess at a location wherein the two features interface with one another. According to an embodiment, the first diameter D1 can be in the range of 1 mm-3 mm, and the diameter of the opening 110 at a lower surface of the encapsulant body 108 can be in the range of 1.10 mm-3.5 mm. In a particular embodiment, the first diameter D1 can be about 2 mm while the diameter of the opening 110 at the lower surface of the encapsulant body 108 can be about 2.1 mm to 2.25 mm. In relational terms, the diameter of the opening at the lower surface 106 can be about 5% to 25% larger than the first diameter D1.

Figure 5:
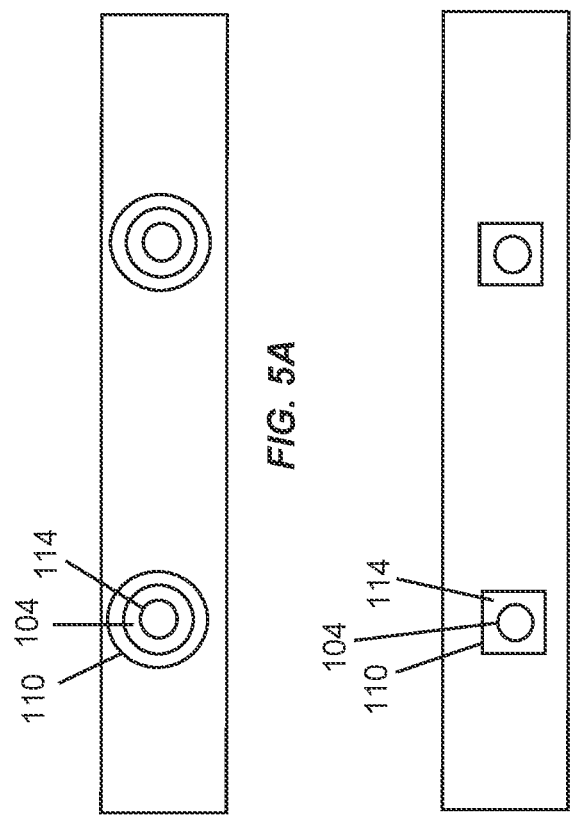
FIG. 5, which includes

Referring to FIG. 5, various plan-view geometries of the openings 110 and recesses 114 are shown. In each of these examples, the opening 110 is formed directly over the recess 114 and is larger than the recess 114 such that the recess 114 is completely exposed by the opening 110. As a result, a portion of the upper surface 104 that completely surrounds the recess 114 is exposed by the opening 110. In this way, the recess 114 is completely exposed and a small lateral margin is provided to ensure that the recess 114 is completely accessible for the insertion of press-fit connectors, e.g., in a manner to be described in further detail below. Moreover, as illustrated, the openings 110 may have different geometries from a plan-view perspective. These geometries can be combined with any of the recess 114 geometries described herein.

Referring to FIG. 6, an alternate technique for forming the recesses 114 and the openings 110 in shown. According to this technique, the recesses 114 are formed before forming the encapsulant body 108. The recesses 114 can be formed according to any of the previously described techniques. In this case, the fixed pins 112 are arranged over the recesses 114 before the encapsulation process and prevent the mold material from forming over the recesses 114 in a similar manner as previously described. Any of the previously described geometries and/or arrangements of the openings 110 and recesses 114 may be obtained by this technique.

Referring to FIG. 7, press-fit connectors 116 are provided. The press-fit connectors 116 are electrically conductive structures. For example, the press-fit connectors 116 may include a core of electrically conductive metal e.g., Cu, Al, etc., with an anticorrosion plating, e.g., Ni, Ag, Au, etc. disposed outside of the core. The press-fit connectors 116 are inserted into the openings 110 such that a base portion 118 of the press-fit connectors 116 is disposed within the recess 114. The larger size of the openings 110 relative to the recesses 114 and/or the tapered geometry of the openings 110 may aid in guiding the press-fit connectors 116 into the recesses 114 during the insertion process. Moreover, as shown, the base portion 118 of the press-fit connectors 116 may comprise a pointed or tapered end that further aids in guiding the press-fit connectors 116 into the recesses 114 during the insertion process. Once inserted into the recesses 114, the press-fit connector 116 is securely retained to the substrate 100 and an interfacing end of the press-fit connector 116 is electrically accessible. In this arrangement, the press-fit connectors 116 can be mated with a circuit interface, such as a printed circuit board, by inserting the interfacing ends of the press-fit connectors 116 into correspondingly shaped receptacles in the circuit interface. The geometry of the press-fit connectors 116 and the receptacles to which they interface with may be such that a force fitting connection exists between the two. To this end, the press-fit connectors 116 may comprise retention features 120 at or near the interfacing ends to aid in this force-fitting connection. The interfacing ends may of the press-fit connectors 116 may be designed to plastically deform and/or may include a spring-loaded contact mechanism to enhance I/O connectivity. Apart from the retention features, the press-fit connectors 116 may comprise a cylindrical core with a diameter in the range of 0.5 mm-3 mm.

According to an embodiment, the press-fit connectors 116 are retained to the substrate 100 by compressive force applied by the substrate 100 to the base portion 118 of the press-fit connector 116. That is, the dimensions of the recess 114 and the base portion 118 of the press-fit connector 116 are such that pressure is applied to the press-fit connector 116 after insertion into the recess 114. Generally speaking, this compressive force arrangement can be made possible by an arrangement whereby the base portion 118 of the press-fit connector 116 has a complementary geometry as the recess 114 and whereby the recess 114 is slightly smaller than the base portion 118 of the press-fit connector 116. For example, a minimum diameter of the recess 114 between two opposite sidewalls of the recess 114, e.g., the first diameter D1 in the case of a uniform width recess 114, can be between about 2% to 15% less than a maximum diameter of the base portion 118 of the press-fit connector 116 that is disposed within the recess 114. Stated in numerical terms, the minimum diameter of the recess 114 can be in the range of 0.5 mm-2.5 mm, whereas the maximum diameter of the base portion 118 of the press-fit connector 116 can be in the range of 0.425 mm-2.45 mm. In particular embodiment, the minimum diameter of the recess 114 is 2.0 mm and the maximum diameter of the base portion 118 is about 2.1 mm.

The material properties of the substrate 100 and the press-fit connectors 116 may be selected to enhance the compressive force applied by the substrate 100 to the base portion 118 press-fit connector 116 and/or to ensure that a stable mechanical connection exists between the two elements. In particular, the material of the press-fit connectors 116 may be relatively harder than the material of the substrate 100. In this context, material hardness may be measured on the Vickers scale (Hv). By selecting the material of the press-fit connector 116 to be relatively harder than the material of the substrate 100 that applies pressure to the press-fit connector 116, this ensures that more plastic deformation occurs in the substrate 100 than in the press-fit connector 116. In one example, the portion of the substrate 100 that applies compressive force on the press-fit connectors 116 comprises pure or substantially pure copper, and the press-fit connectors 116 comprises a copper alloy that is harder than pure or substantially pure copper, e.g., K88 alloy copper.

The press-fit connectors 116 may be secured to the power module by exclusively mechanical force. That is, no adhesive bonds or welded bonds may be provided between the press-fit connectors 116 and the substrate 100. Alternatively, a conductive adhesive, e.g., solder, sinter, glue, etc., may be provided between the press-fit connectors 116 and the substrate 100 so as to provide further mechanical retention. In addition to the compressive force applied by the substrate 100, the encapsulant body 108 may additionally provide a degree or mechanical pressure and/or mechanical retention of the press-fit connectors 116.

Referring to FIGS. 7B and 7C, optional arrangements of the press-fit connectors 116 are shown. In the embodiment shown in FIG. 7B, the press-fit connectors 116 are arranged to extend away from the substrate 100 in opposite directions. This configuration allows for electrical connectivity on two different sides of the assembly. While the depicted embodiment shows one of the openings 110 in the encapsulant body 108 disposed over the press-fit connector 116 that extends out from the rear surface of the substrate 100, in other embodiments this opening may be omitted. In the embodiment shown in FIG. 7C, the press-fit connectors 116 comprise a widened section 120 above the base portion 118 that is inserted in the recess 114. The widened section 120 may have a diameter corresponding to the diameter of the opening, e.g., within 100% and 105% of the diameter of the opening, so that a form-fitting connection exists. In this way, additional mechanical stabilization for the press-fit connector 116 is provided.

Figure 8:
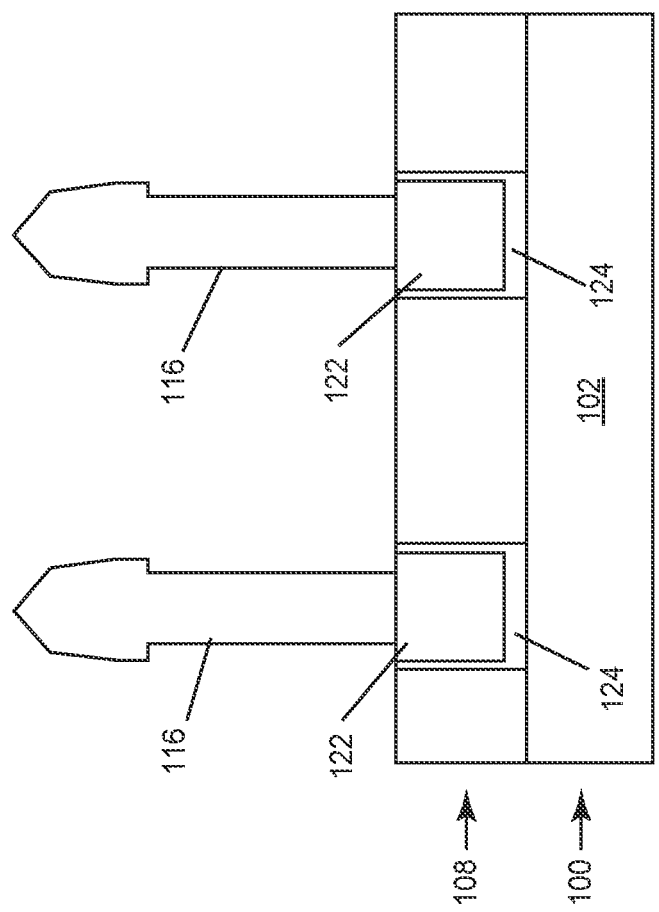
FIG. 8 illustrates from a cross-sectional perspective technique for securing the press-fit connectors with receptacles that are disposed within the openings, according to an embodiment.

Referring to FIG. 8, an alternate technique for securely retaining the press-fit connector 116 to the substrate 100 is shown. According to this technique, after forming the openings 110, a receptacle 122 is arranged in the openings 110 and attached to the substrate 100. The receptacle 122 can be a tubular structure of metal or plastic (e.g., conductive plastic) that is dimensioned to receive the press-fit connectors 116. The receptacle 122 can be secured to the substrate 100 using a conductive adhesive 124, e.g., solder, sinter, conductive glue, etc. After securing the receptacle 122 to the substrate 100, the press-fit connectors 116 can be inserted into the receptacles 122 and securely retained thereafter. The receptacles 122 can be dimensioned and have a material composition so as to apply compressive force to the press-fit connector 116 in a similar manner as previously described with respect to the recesses 114 and the press-fit connector 116. Separately or in combination, a further conductive adhesive 124 may be provided within the receptacle 122 to provide an electrical and mechanical connection.

Figures 9, 9A:
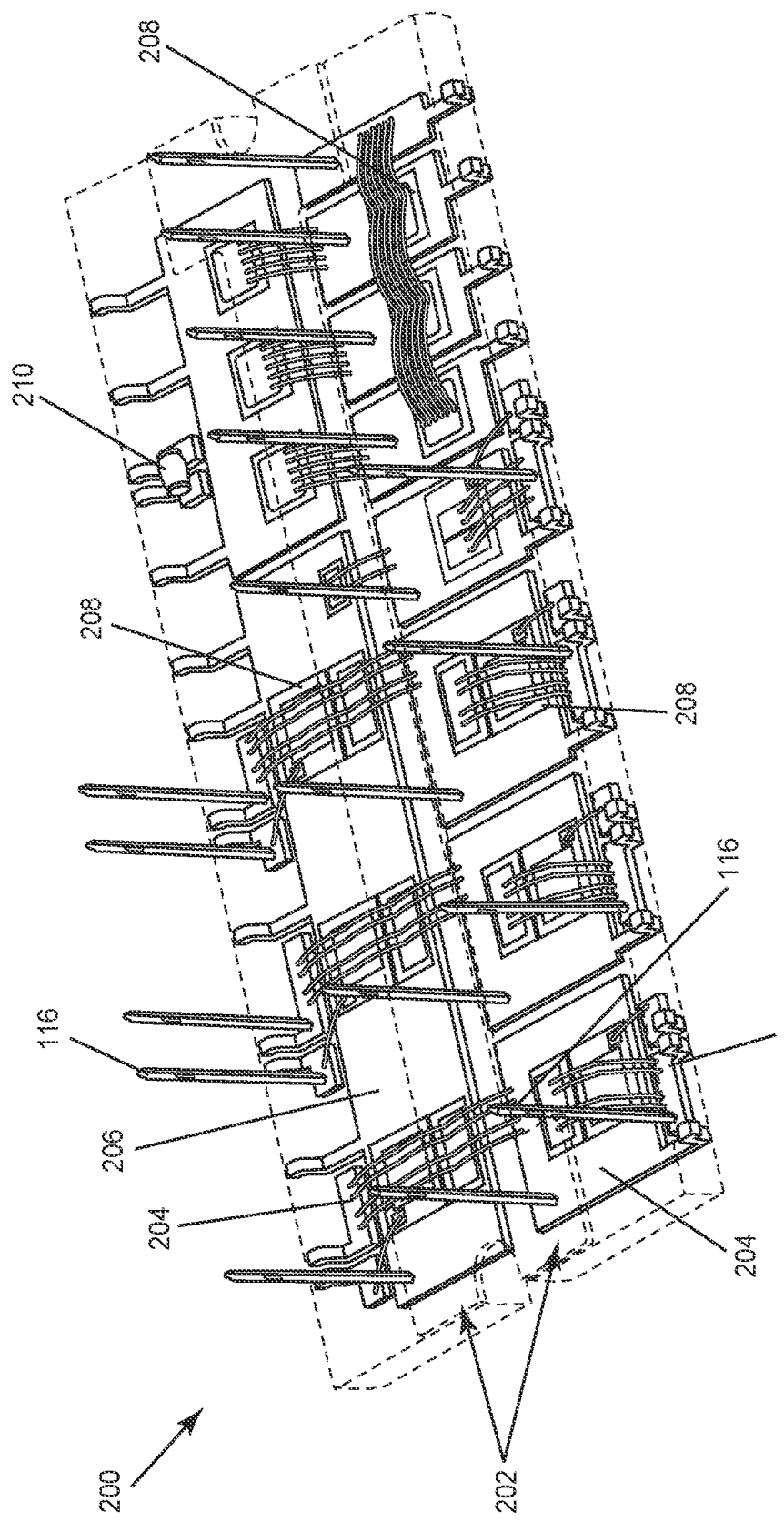
FIG. 9, which includes
FIGS. 9A and 9B, illustrates from an isometric view a power semiconductor module comprising press-fit connectors secured to a lead frame.
Figures 9, 9B:
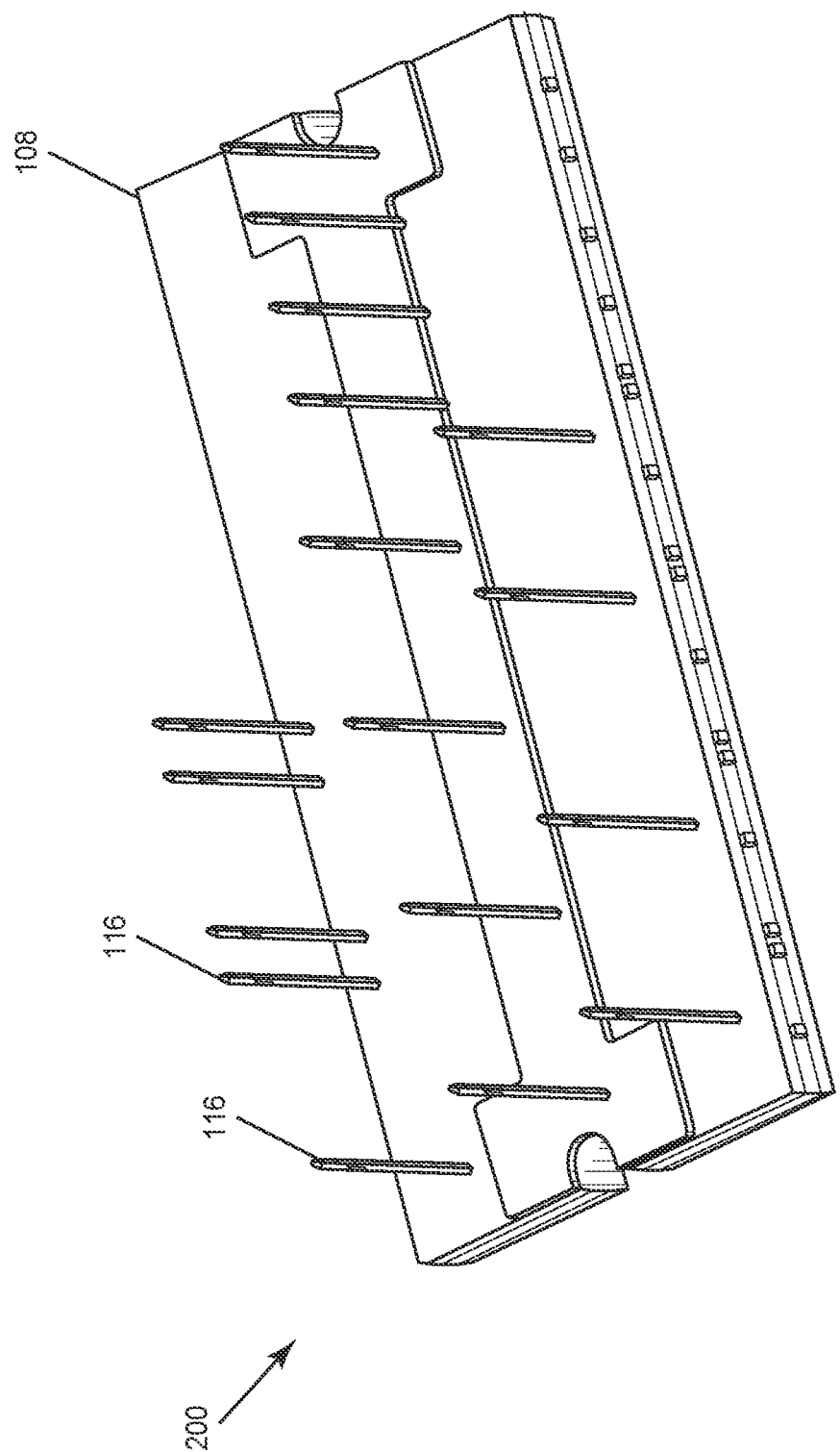

Referring to FIG. 9, a semiconductor power module 200 with press-fit connectors 116 is depicted, according to an embodiment. The semiconductor power module 200 comprises a metal lead frame 202 with a plurality of die pads 204 and landing pads 206 that are spaced apart from the die pads 204. The metal lead frame 202 can be provided from a relatively uniform thickness piece of conductive metal with a generally planar upper and lower surfaces, and the features of the substrate 100 (e.g., the die pads 204 and landing pads 206) are formed by metal processing techniques such as etching, stamping, punching, coining, etc. The semiconductor power module 200 comprises a plurality of semiconductor dies 208 mounted on the die pads 204. The semiconductor dies 208 may be mounted on the die pads 204 of the substrate 100 by an adhesive, e.g., solder, sinter, glue, etc. In the case that the semiconductor dies 208 are configured as vertical devices (e.g., as shown) the semiconductor dies 208 may be mounted to provide an electrical connection between a lower surface 106 terminal (e.g., drain, collector, etc.) of the semiconductor die 208 and the respective die pad 206. According to one particular technique, the semiconductor dies 208 are soldered by a diffusion soldering technique wherein a very thin layer of solder material (e.g., less than 30 μm thick) layer is provided and the solder material is reflowed to provide a soldered joint comprising predominantly intermetallic phases.

The semiconductor dies 208 may be electrically connected to one another and/or to other different portions of the semiconductor substrate 100. These electrical connections may be formed using bond wires (as shown), metal clips, ribbons, etc. The semiconductor power module 200 additionally comprises an encapsulant body 108 of electrically insulating encapsulant material that encapsulates the semiconductor dies 208 and associated electrical connections. The encapsulant body 108 can comprise any of the materials and may be formed according to any of the techniques as previously described.

According to an embodiment, the semiconductor dies 208 are configured as discrete power transistors. A discrete power transistor is a switching device that is rated to accommodate voltages of at least 100 V (volts) and more commonly on the order of 600 V, 1200V or more and/or is rated to accommodate currents of at least 1A (amperes) and more commonly on the order of 10A, 50A, 100A or more. Exemplary device types of discrete power transistors include MOSFETs (Metal Oxide Semiconductor Field Effect Transistors), IGBTs (Insulated Gate Bipolar Transistors), and HEMTs (High Electron Mobility Transistors), for example. More generally, the semiconductor dies 208 can have any type of device configuration, e.g. discrete device configurations such as discrete diodes, discrete transistors, discrete JFETs, etc. and integrated circuit configurations such as logic devices, controllers, driver circuits, etc. At least some of the semiconductor dies 208 may be vertical devices that are configured to current flowing between a main surface and an opposite facing rear surface of the semiconductor die. At least some of the semiconductor dies 208 may be lateral devices that are configured to current flowing in a direction parallel to main surface and an opposite facing rear surface of the semiconductor die.

According to an embodiment, the semiconductor power module 200 is configured as a power converter circuit. For example, the semiconductor power module 200 may be configured as a DC to DC converter, DC to AC converter, AC to DC converter, etc. These power converter circuits may comprise one or more half-bridge circuits, wherein a pair of semiconductor dies 208 are configured as the high-side switch and the low-side switch of the half-bridge circuit. Optionally, the semiconductor power module 200 may comprise additional logic dies that are configured to control the switching operation of the discrete power transistor dies which form the half-bridge circuit. Separately or in combination, the power module may comprise additional passive components that are associated with the power conversion circuit, e.g., DC-link, smoothing, etc. For example, as shown, the power module comprises a discrete capacitor 210 mounted on isolated landing pads 206 of the substrate 100.

The semiconductor power module 200 comprises a plurality of the press-fit connectors 116 secured to the lead frame 202. As shown, the press-fit connectors 116 may be secured to the die pads 204 or the landing pads 206. In this case, the die pads 204 or the landing pads 206 may correspond to the metal region 102 of the substrate 100 in the previous description with reference to FIGS. 1-8. In the case of the press-fit connectors 116 secured to the die pads 204, these press-fit connectors 116 may provide an external point of electrical contact to a lower surface terminal of the semiconductors dies (e.g., drain, collector) via the die pad 104. In the case of the press-fit connectors 116 secured to the landing pads 206, these press-fit connectors 116 may provide an external point of electrical contact to an upper surface terminal of the semiconductors dies (e.g., source, emitter, gate, etc.) via the landing pad 106.

The semiconductor power module 200 module having the press-fit connectors 116 secured to the lead frame 202 as shown has notable advantages over other alternatives. In comparison to a power module that utilizes a power electronics substrate, e.g., DBC, AMB, IMS, etc. and/or utilizes a custom designed plastic housing, a substantial cost savings is realized, as the metal processing techniques needed to form the lead frame 202 and press-fit connection are substantially lower. In comparison to a leaded package design that comprises metal leads protruding out from sidewalls of the package body, the press-fit concept eliminates the area required for elongated leads on a lead frame strip, thereby providing better space efficiency and hence lower cost bath processing. Moreover, the press-fit concept offers a great deal of flexibility with respect to the location of the package terminals as the entire area of the package is available to arrange the package terminals instead of just the package sidewalls, as is the case for a leaded package. This can lead to favorable improvements in creepage and clearance, i.e., the shortest distance between exposed conductive surfaces along an insulating body and through air, respectively.

The semiconductor module of FIG. 9 may comprise additional combinations of circuit carriers, lead frame structures and/or external connectors for further integration. The following exemplary embodiments illustrate some of these variations. In an embodiment, the semiconductor power module 200 additionally comprises one ore more PCBs (printed circuit boards) encapsulated within the encapsulant body 108 and spaced apart from the lead frame 202. These additional PCBs may accommodate further electronic components such as driver devices, passives, etc. These additional PCBs can be arranged above, below, or laterally spaced apart from the lead frame 202. These additional PCBs may comprise separate press-fit connectors 116 that are attached to the PCBs, e.g., by a mechanical connection according to any of the techniques described herein and/or by a soldered connection. The press-fit connectors 116 may protrude out from the encapsulant body 108 in a similar manner as the depicted press-fit connectors 116 and therefore provide separate electrical access to the additional PCBs. The size and arrangement of these press-fit connectors 116 may be the same or different from the depicted press-fit connectors 116. Instead of press-fit connectors 116, similar electrical connectors may be connected to the PCS and protrude out from the encapsulant body 108 so as to provide solderable electrical terminals. These electrical connectors can have a similar or identical configuration as a typical lead structure, e.g., in a surface mount device configuration, for example.

Figure 10:
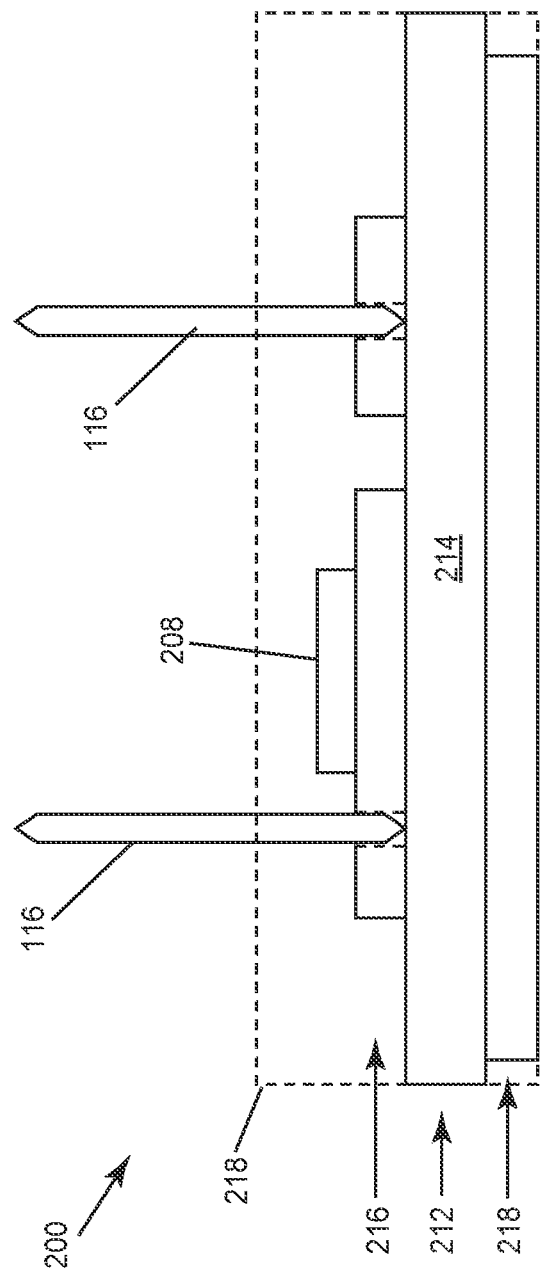
FIG. 10 illustrates from a cross-sectional perspective a power semiconductor module comprising press-fit connectors secured to a power electronics substrate.
Figure 11:
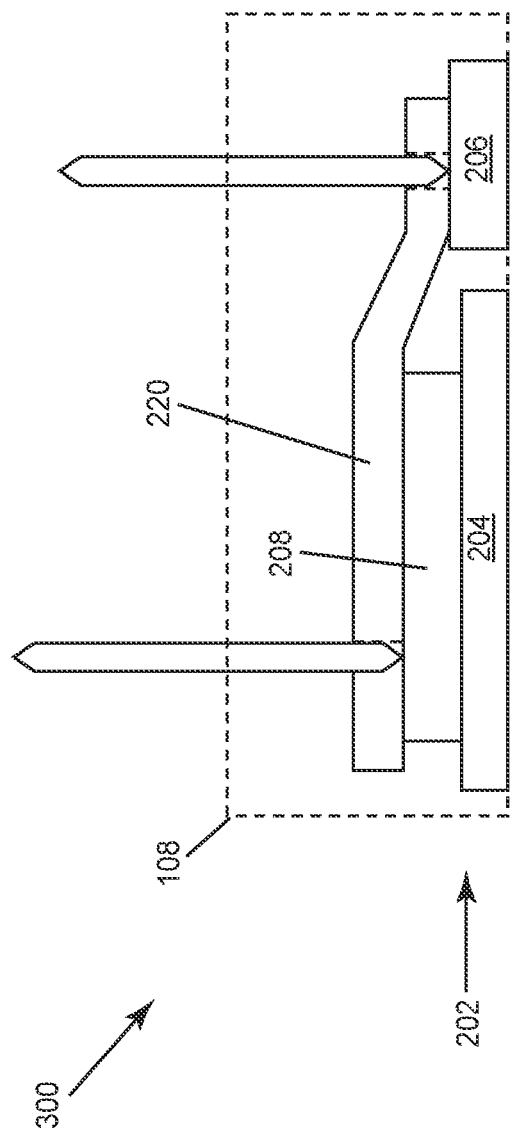
FIG. 11 illustrates from a cross-sectional perspective a semiconductor package comprising press-fit connectors secured to a metal clip.

Referring to FIG. 10, a semiconductor power module 200 is depicted, according to another embodiment. In this embodiment, the semiconductor power module 200 comprises a power electronics substrate 212. The power electronics substrate 212 may be a DBC (direct bonded copper) substrate, an AMB (active metal brazed) substrate, or an IMS (insulated metal substrate) substrate, for example. The power electronics substrate 100 comprises an electrically insulating substrate 214 and a structured metallization layer 216 disposed on a electrically insulating substrate 100. The electrically insulating substrate 214 can comprise a ceramic or ceramic composite and the structured metallization layer 216 can be a structured layer or copper or copper alloy, for example. A semiconductor die 208 such as a power device may mounted on a portion of the structured metallization layer 216. As shown, the press-fit connectors 116 may be secured to portions of the structured metallization layer, wherein these portions correspond to the metal region 102 of the substrate 100 in the discussion with reference to FIGS. 1-7. The power electronics substrate 100 may comprise a second metallization layer 218 disposed on a rear surface of the electrically insulating substrate 100 which may be mated with a heat sink for example. The semiconductor power module 200 may optionally comprise a plastic housing 218 and/or may comprise an encapsulant such as a silicon based potting compound covering the power electronics substrate 100.

Referring to FIG. 10, a semiconductor package 300 is depicted, according to an embodiment. The semiconductor package 300 comprises a metal lead frame 202 with a die pad 204 and one or more landing pads 206 spaced apart from the die pad. The metal lead frame 202 can be provided from a relatively uniform thickness piece of conductive metal with a generally planar upper and lower surface 106 is provided, and the features of the substrate 100 (e.g., the die pads 204 and landing pads 206) are formed by metal processing techniques such as etching, stamping, punching, coining, etc. A semiconductor die 208, such as a power semiconductor die is mounted on the die pad 204. The semiconductor package 300 comprises a metal interconnect clip 220 that provides an electrical connection between an upper surface terminal of the semiconductor die 208 and one of the landing pads 206. The semiconductor package 300 additionally comprises an encapsulant body 108 of electrically insulating encapsulant material that encapsulates the semiconductor dies 208 and associated electrical connections. The encapsulant body 108 can comprise any of the materials and may be formed according to any of the techniques as previously described. The semiconductor package 300 additionally comprises press-fit connectors 116 that are secured to the metal interconnect clip, wherein the metal interconnect clip corresponds to the metal region 102 of the substrate 100 in the discussion with reference to FIG. 1. The press-fit connectors 116 may eliminate some or all package leads, thereby improving space efficiency and/or providing advantageous characteristics with respect to creepage and clearance in a similar manner as previously discussed with reference to the power module of FIG. 9.

Referring to FIG. 12, a semiconductor assembly 400 is depicted, according to an embodiment. The semiconductor assembly 400 comprises a pair of printed circuit boards 402 with a power device arranged in a sandwich configuration between the pair of printed circuits boards 402. The power device comprises a substrate 100 with one or more semiconductor dies (not shown) mounted thereon. These semiconductor dies 208 may be configured as a power conversion circuit, e.g., as previously described. The pair of printed circuits boards 402 may accommodate additional devices associated with the power conversion circuit, e.g., drivers, sensors, measurement circuits, etc. As shown, a passive element 404 may additionally be sandwiched between and electrically connected to the pair of printed circuits boards, for example. This passive element 404 may be a DC link capacitor, for example. In this case, the press-fit connectors 116 extend away from the substrate 100 in both directions. The semiconductor device semiconductor assembly 400 therefore comprises one of the press-fit connectors 116 extending into each of the two printed circuit boards 402 and therefore electrically connected to both of the printed circuit boards 402. Additional separation elements 406 may be interposed between the substrate 100 and the printed circuits boards. These separation elements 406 may be configured as conductive heat sinks, e.g., as copper structures. Alternatively, these additional separation elements 406 may comprise thermal interface material if electrical isolation and thermal conduction is preferred, for example. Alternatively, these additional separation elements 406 may comprise an electrical insulator such as epoxy material if high electrical isolation is preferred. Alternatively, these additional separation elements 406 may be omitted altogether with just a lead frame structure disposed between the printed circuit boards 402.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of forming a semiconductor device, the method comprising:
   providing a substrate that comprises a metal region;
   forming an encapsulant body of electrically insulating material on an upper surface of the metal region;
   forming an opening in the encapsulant body; and
   inserting a press-fit connector into the opening;
   wherein after inserting the press-fit connector into the opening, the press-fit connector is securely retained to the substrate and an interfacing end of the press-fit connector is electrically accessible,
   wherein the encapsulant body is formed by a molding process whereby liquified mold material is formed on the substrate and subsequently hardened, wherein forming the opening comprises arranging a fixed pin over the substrate prior to the molding process, and wherein the fixed pin prevents the liquified mold material from forming at a location corresponding to the opening.

2. The method of claim 1, further comprising forming a recess in the upper surface of the metal region, wherein the opening is formed directly over the recess, and wherein the opening is larger than the recess such that the recess is completely exposed by the opening.

3. The method of claim 2, wherein the recess has a first diameter at the upper surface of the metal region, and wherein a diameter of the opening at a lower surface of the encapsulant body that interfaces with the upper surface of the metal region is greater than the first diameter.

4. The method of claim 2, wherein the opening is tapered such that diameter of the opening gradually increases moving away from the lower surface of the encapsulant body.

5. The method of claim 4, wherein the recess is formed before forming the encapsulant body.

6. The method of claim 4, wherein the recess is formed after forming the encapsulant body.

7. The method of claim 2, wherein the recess extends completely through the metal region, and wherein the recess is formed by drilling the upper surface of the metal region and by drilling a rear surface of the metal region that is opposite from the upper surface of the metal region.

8. The method of claim 2, wherein inserting the press-fit connector into the opening comprises inserting the press-fit connector into the recess, and wherein the press-fit connector is securely retained to the substrate by compressive force applied by the substrate to a base portion of the press-fit connector.

9. The method of claim 8, wherein the base portion of the press-fit connector has a higher material hardness than the metal region.

10. The method of claim 1, further comprising arranging a receptacle in the opening and attaching the receptacle to the substrate, wherein inserting the press-fit connector into the opening comprises inserting the press-fit connector into the receptacle, and wherein after inserting the press-fit connector into the opening the press-fit connector is securely retained to the substrate via the receptacle.

11. The method of claim 1, wherein the substrate is an entirely metal structure.

12. The method of claim 1, wherein the substrate is a power electronics substrate that comprises an electrically insulating substrate and a structured metallization layer disposed thereon, and wherein the metal region is a portion of the structured metallization layer.

13. A semiconductor device, comprising:
a substrate that comprises a metal region;
an encapsulant body of electrically insulating material on an upper surface of the metal region;
an opening in the encapsulant body;
a press-fit connector arranged in the opening and securely retained to the substrate such that an interfacing end of the press-fit connector is electrically accessible; and
a recess in the upper surface of the metal region, and wherein the opening is directly over the opening and is larger than the recess such that the recess is completely exposed by the opening.

14. The semiconductor device of claim 13, wherein the press-fit connector is securely retained to the substrate by compressive force applied by the substrate to a base portion of the press-fit connector.

15. The semiconductor device of claim 14, wherein the press-fit connector comprises K88 copper alloy, and wherein the metal region comprises a metal with a lower material hardness than K88 copper alloy.

16. The semiconductor device of claim 13, further comprising one or more power semiconductor devices mounted on the substrate and encapsulated by the molded body, and wherein the press-fit connector provides a point of electrical contact to a terminal of the one or more power semiconductor devices via the metal region.

17. The semiconductor device of claim 16, wherein the semiconductor device is a power semiconductor module that comprises a power converter circuit.

18. The semiconductor device of claim 17, wherein the substrate is arranged between two printed circuit boards, and wherein the semiconductor device comprises one of the press-fit connectors extending into each of the two printed circuit boards.

* * * * *